United States Patent [19]
Shon et al.

[11] Patent Number: 5,677,209
[45] Date of Patent: Oct. 14, 1997

[54] METHOD FOR FABRICATING A VERTICAL BIPOLAR TRANSISTOR

[75] Inventors: Dae-Heon Shon, Keongki-Do; Kyung-Hwa Jo, Seoul, both of Rep. of Korea

[73] Assignee: Daewoo Electronics Co., Ltd., Seoul, Rep. of Korea

[21] Appl. No.: 634,267

[22] Filed: Apr. 18, 1996

[30] Foreign Application Priority Data

Apr. 21, 1995 [KR] Rep. of Korea .................. 95-9388

[51] Int. Cl.$^6$ .................................. H01L 21/265
[52] U.S. Cl. .................. 437/31; 437/74; 437/76; 437/77; 148/DIG. 10; 148/DIG. 11; 148/DIG. 39
[58] Field of Search .................. 437/31, 74, 76, 437/77; 148/DIG. 10, 11, 39

[56] References Cited

U.S. PATENT DOCUMENTS

| | | | |
|---|---|---|---|
| 3,293,087 | 12/1966 | Porter | 437/77 |
| 3,547,716 | 12/1970 | De Witt et al. | 437/77 |
| 3,607,465 | 9/1971 | Frouin | 437/77 |
| 3,615,932 | 10/1971 | Makimoto et al. | 437/77 |
| 3,703,420 | 11/1972 | Vora | 437/77 |
| 3,787,253 | 1/1974 | Ashar | 437/77 |
| 3,886,004 | 5/1975 | Bruhez | 437/77 |
| 3,929,526 | 12/1975 | Nuttall et al. | 437/77 |
| 3,961,340 | 6/1976 | Encinas | 437/76 |
| 3,971,059 | 7/1976 | Dunkley et al. | 437/74 |
| 3,993,512 | 11/1976 | Encinas | 437/77 |
| 4,106,049 | 8/1978 | Shinozaki et al. | 437/31 |
| 4,543,707 | 10/1985 | Ito et al. | 29/578 |
| 4,939,099 | 7/1990 | Seacrist et al. | 437/76 |
| 4,965,215 | 10/1990 | Zambrano et al. | 437/74 |
| 4,998,836 | 3/1991 | Zambrano et al. | 437/31 |
| 5,087,579 | 2/1992 | Tomassetti | 437/74 |
| 5,132,235 | 7/1992 | Williams et al. | 437/77 |
| 5,156,989 | 10/1992 | Williams et al. | 437/77 |
| 5,200,347 | 4/1993 | Wang et al. | 437/31 |
| 5,246,871 | 9/1993 | Zambrano et al. | 437/77 |
| 5,302,534 | 4/1994 | Monk et al. | 437/31 |
| 5,394,007 | 2/1995 | Reuss et al. | 437/77 |
| 5,529,939 | 6/1996 | Lapham et al. | 437/77 |

FOREIGN PATENT DOCUMENTS

| | | | |
|---|---|---|---|
| 1218603 | 1/1971 | United Kingdom | 437/76 |
| 2234111 | 1/1991 | United Kingdom | 437/31 |

*Primary Examiner*—John Niebling
*Assistant Examiner*—Long Pham
*Attorney, Agent, or Firm*—Foley & Lardner

[57] ABSTRACT

A method for reproducibly fabricating a thin base region of a vertical bipolar transistor therein, which has a high transfer speed and increases a current driving force, and a method for increasing the isolating effect of the vertical bipolar transistor through forming a second buried layer implanting N-type impurity into an upper peripheral portion of first buried layer and activating the implanted N-type impurity, then out-diffusing the activated N-type impurity at the same time as growing the epitaxial layer, so the second buried layer definitely separates the elements of the transistor. Both the first buried layer and the second buried layer define a portion of epitaxial layer to form an active region which functions as a collector region. A subcollector region is formed above first buried layer in active region, and a base region is formed at a first upper portion of the active region to overlay the subcollector region. Therefore, the base region having a thin width is reproducibly formed by implanting N-type impurity and annealing the implanted N-type impurity in a nitrogen atmosphere, and separating the elements of the transistor is ensured through forming second buried layer according to the present invention.

17 Claims, 7 Drawing Sheets

METHOD FOR FABRICATING A VERTICAL BIPOLAR TRANSISTOR

BACKGROUND OF THE INVENTION

1. Field of the Invention

The present invention relates to a method for fabricating a vertical bipolar transistor, and more particularly to a method for reproducibly fabricating a thin base region of the vertical bipolar transistor therein so as to have a high transfer speed and to increase a current driving force, and an isolating effect of the vertical bipolar transistor.

2. Description of the Prior Art

Generally, there are two types of bipolar transistors. That is, a lateral bipolar transistor and a vertical bipolar are widely known. In the lateral bipolar transistor, the processability of the high frequency signal is lowered and the current driving force decreases because a current flows around a surface of the lateral bipolar transistor. Therefore, when a great current driving force is necessary or when the frequency of the applied current is high, it is preferable to use the vertical bipolar transistor. In the vertical transistor, the current driving force is excellent because the current flows in the perpendicular direction in the semiconductor substrate of the bipolar transistor. In the vertical transistor, the current driving force is excellent because the current flows in the perpendicular direction in the semiconductor substrate of the bipolar transistor. Also, a thin base width can be obtained by controlling the base width, thus a high frequency signal may be processed.

One example of a vertical bipolar transistor is disclosed in U.S. Pat. No. 5,302,534 (issued to David J. Monk et. al). The vertical bipolar transistor is of a PNP type and has a thin epitaxial layer, and thus a thin base width may be formed in proportion to the thin epitaxial layer.

Figure 1:
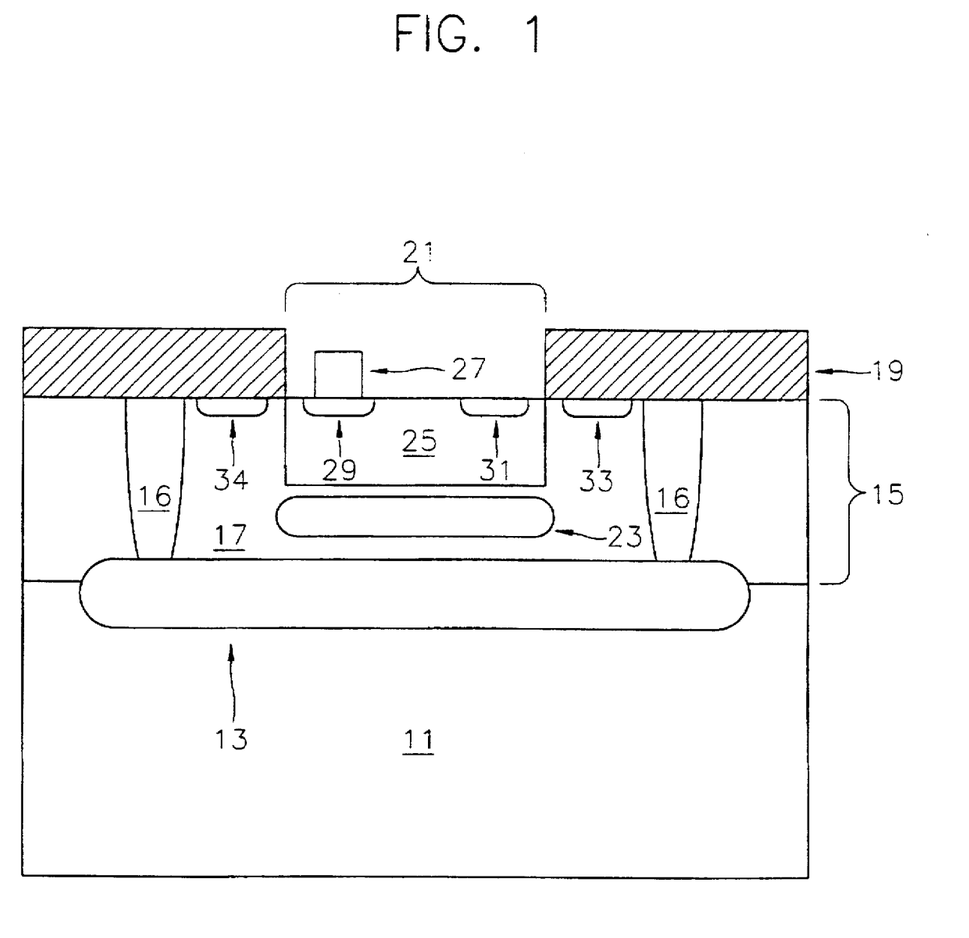
FIG. 1 is a view for showing a cross section of a conventional vertical bipolar transistor.

FIG. 1 is a view for showing a cross section of the above vertical PNP transistor. Referring to FIG. 1, the vertical PNP transistor has a P-type semiconductor substrate 11. An N-type buried layer 13 is formed on an upper portion of P-type substrate 11. A P-type epitaxial layer 15 which functions as a collector region has been grown on P-type substrate 11 having N-type buried layer 13 on a surface portion thereof. An N-type sink 16 is formed in epitaxial layer 15 from the surface of epitaxial layer 15 to N-type buried layer 13 so that N-type sink 16 overlaps (or contacts) N-type buried layer 13 to separate the elements of the vertical transistor in the horizontal direction by defining a P-type well 17 in epitaxial layer 15. A base mask 19 is formed with an opening 21 to expose a portion of P-type well 17 on the surface of epitaxial layer 15. A P-type collector enhancement 23 is formed above N-type buried layer 13 by implanting a dopant through opening 21 of base mask 19. An N-type base region 25 is formed above collector enhancement 23 by implanting a dopant through opening 21 of base mask 19. A polysilicon emitter contact region 27 is formed on a portion of a surface of base region 25. A P-type emitter region 29 is formed under emitter contact region 27 and at an upper portion of base region 25 by diffusing the dopant from emitter contact region 27. An N-type base contact region 31 is formed at another upper portion of base region 25, and a plurality of collector contact regions 33 and 34 are formed at surface portions of P-type well 17 except the portion where base region 25 is formed.

A method for fabricating the above mentioned vertical PNP transistor will be described as follows.

After an N-type doped region is formed at an upper portion of P-type semiconductor substrate 11 by using a conventional method and then the N-type doped region and the substrate 11 are covered by P-type epitaxial layer 15 to form N-type buried layer 13. Then, N-type sink 16 is formed from the surface of epitaxial layer 15 to N-type buried layer 13 to contact N-type buried layer 13 by vertically implanting an N-type impurity from the surface of epitaxial layer 15. Consequently, a portion of epitaxial layer 15 is defined by N-type buried layer 13 and N-type sink 16 to form P-type well 17. After epitaxial layer 15 is covered with base mask 19 which has opening 21 in order to expose a portion of P-type well 17, P-type collector enhancement 23 is formed at a first portion (having a first depth) of P-type well 17 above N-type buried layer 13 by implanting a dopant through opening 21 of base mask 19. Also, N-type base region 25 is formed at a second position above P-type collector enhancement 23 (having a second depth shallower than the first depth of P-type collector enhancement 23) of P-type well 17 by implanting an N-type impurity through opening 21 of base mask 19. Subsequently, polysilicon emitter contact region 27 is formed on a first surface portion of base region 25 so that a diffusion of ion occurs from polysilicon emitter contact region 27, thereby forming P-type emitter region 29. Base contact region 31 is formed at a second upper portion of base region 25 to be located adjacent to emitter region 29. Further, a plurality of collector contact regions 33 and 34 are formed at the upper surface portions of P-type well 17 except the portion where base region 25 is formed.

However, according to the above described conventional vertical PNP transistor, since the sink is formed by implanting an impurity such as phosphorus from the surface of the epitaxial layer after growing the epitaxial layer, the difference in the concentration gradient is generated from the surface of the epitaxial layer to the N-type buried layer. Thus, the separation of the transistor elements may be ensured at the contact region between the sink and the N-type buried layer. Therefore, the heavily implanting of the N-type impurity is necessary in order to ensure the separation of the transistor elements. Also, the characteristic of the transistor may be lowered due to the parasite capacitance resulting from the extension of the active region which is generated from the lateral diffusion of the sink because the sink is formed by diffusing the implanted impurity after growing the epitaxial layer. Since the conventional vertical PNP transistor has a thin epitaxial layer, each of the impurities of the base region and the collector enhancement is diffused through the influence of the subsequent processes which follow the formation of the base region and the collector enhancement. This happens even though the base region and the collector enhancement are formed by implanting impurities through the opening the mask. Hence, the precise position controlling of both the base region and the collector enhancement is difficult.

SUMMARY OF THE INVENTION

Considering the above-mentioned problems, it is a first object of the present invention to provide a method for fabricating a vertical bipolar transistor, which exactly controls a thin base width and a position of base.

It is a second object of the present invention to provide a method for fabricating a vertical bipolar transistor, which definitely separates the elements of the vertical bipolar transistor and minimizes the size of an active region of the vertical bipolar transistor to produce a vertical bipolar transistor which has improved characteristics.

To achieve the above objects, the method for fabricating a vertical bipolar transistor according to the present invention, comprises the steps of:

i) implanting a first impurity of a second conductivity type is implanted into a surface portion of a semiconductor substrate of a first conductivity type, and annealing the implanted first impurity of the second conductivity type to form a first buried layer;

ii) implanting a second impurity of the second conductivity type into an upper peripheral portion of the first buried layer, and activating the implanting second impurity of the second conductivity type;

iii) defining an active region by growing an epitaxial layer of the first conductivity type on the semiconductor substrate having the first buried layer therein at the same time as out-diffusing the activated second impurity of the upper peripheral portion of the first buried layer to form a second buried layer of the second conductivity type having a higher impurity concentration than that of the first buried layer, both the first buried layer and the second buried layer defining a portion of the epitaxial layer as the active region;

iv) forming a subcollector region of the first conductivity type in a portion of the active region above the first buried layer;

v) forming an isolating oxide film on a portion of the active region and on the epitaxial layer except the active region;

vi) forming a base region of the second conductivity type by implanting a third impurity of the second conductivity type into a first upper portion of the active region, and annealing the implanted third impurity of the second conductivity type;

vii) forming an emitter region of the first conductivity type at a first upper portion of the base region at the same time as forming a collector contact region of the first conductivity type at a second upper portion of the active region, the collector contact region having a higher impurity concentration than that of the epitaxial layer;

viii) forming a base contact region of the first conductivity type at a second upper portion of the base region, the base contact region having a higher impurity concentration than that of the base region; and ix) forming a base electrode on a surface of the base contact region, an emitter electrode on a surface of the emitter region and a collector electrode on a surface of the collector contact region.

The first buried layer may be formed by implanting the first impurity of the second conductivity type at an energy of between approximately 20 KeV and 60 KeV and at a dosage of approximately $1 \times 10^{15}$ atoms/cm$^2$ to $1 \times 10^{16}$ atoms/cm$^2$, and annealing the implanted first impurity of the second conductivity type at a temperature of between 1150° C. and 1250° C. and for 200 minutes to 300 minutes in an oxygen atmosphere.

As the second impurity of the second conductivity type, phosphorus is used. The second buried layer may be formed by implanting the phosphorus at an energy of between approximately 20 KeV and 50 KeV and at a dosage of approximately $5 \times 10^{15}$ atoms/cm$^2$ to $5 \times 10^{16}$ atoms/cm$^2$, and then annealing the implanted phosphorus at a temperature of between 1000° C. and 1150° C. and for 30 minutes to 60 minutes in an oxygen atmosphere to be activated.

The subcollector region may be formed by implanting an impurity of the first conductivity type at an energy of between approximately 0.5 MeV and 1.5 MeV and at a dosage of approximately $5 \times 10^{12}$ atoms/cm$^2$ to $5 \times 10^{13}$ atoms/cm$^2$, and then annealing the implanted impurity of the first conductivity type at a temperature of between 900° C. and 1000° C. and for 60 minutes to 100 minutes in a nitrogen atmosphere.

The base region may be formed by implanting the third impurity of the second conductivity type at an energy of between approximately 20 KeV and 30 KeV and at a dosage of approximately $5 \times 10^{13}$ atoms/cm$^2$ to $1 \times 10^{14}$ atoms/cm$^2$, and annealing the implanted third impurity of the second conductivity type at a temperature of between 900° C. and 1000° C. and for 30 minutes to 60 minutes in a nitrogen atmosphere.

In the method for fabricating the vertical bipolar transistor according to the present invention, the second buried layer is formed by implanting an impurity and activating the implanted impurity at the same time as growing the epitaxial layer, so the second buried layer can definitely separate the elements of the transistor. The distance between the subcollector region and the isolating region (formed between the first buried layer and the second buried layer) can be adjusted by considering the subcollect region which is subsequently formed since the impurity is implanted into the adequate upper peripheral portion of the first buried layer to form the second buried layer. Thus, the parasite collector capacitance which is generated between the subcollector region and the isolating region may be minimized. Also, the base region which has a thin width can be reproducibly formed by implanting the impurity and then annealing the implanted impurity.

BRIEF DESCRIPTION OF THE DRAWINGS

The above objects and other advantages of the present invention will become more apparent by describing in detail the preferred embodiments thereof with reference to the attached drawings in which.

DETAILED DESCRIPTION OF THE PREFERRED EMBODIMENTS

A method for fabricating a vertical bipolar transistor according to the present invention will be described in detail with reference to the accompanying drawings.

Figure 2:
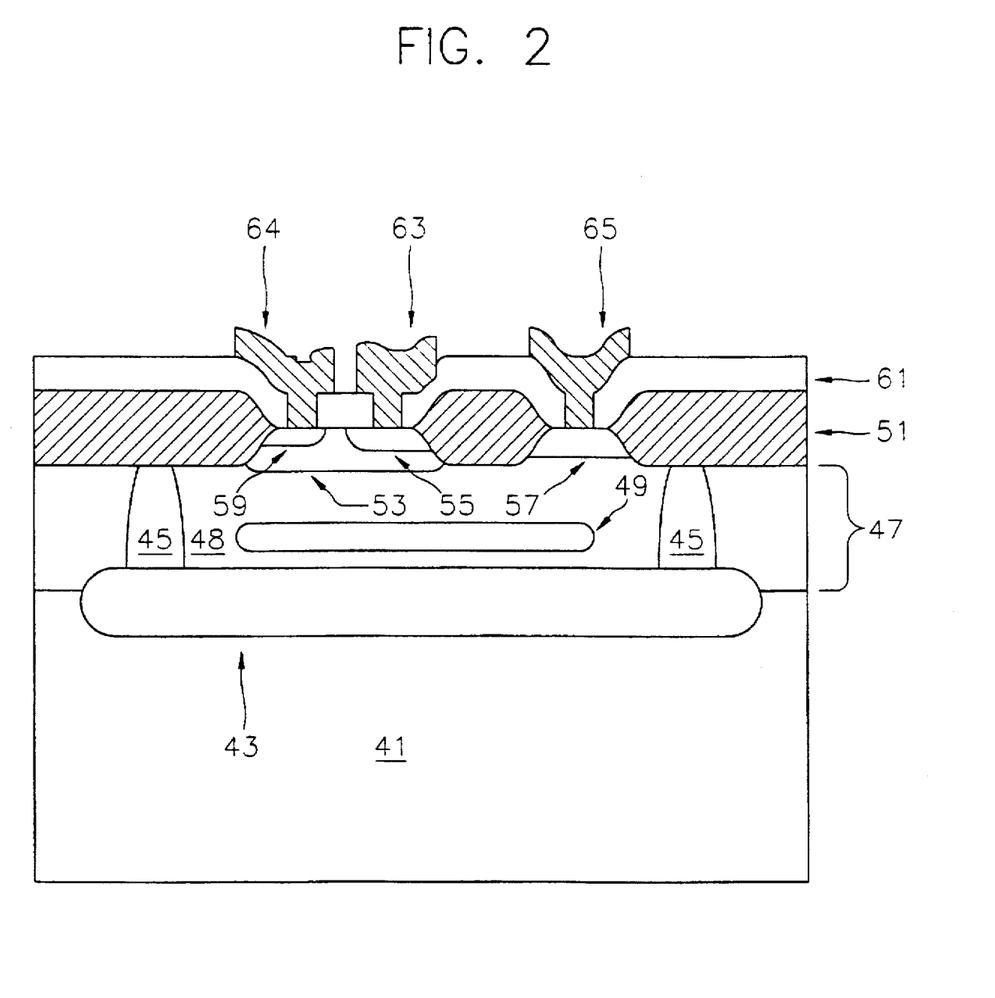
FIG. 2 is a view for showing a cross section of a vertical bipolar transistor which has been prepared according to one embodiment of the present invention.

FIG. 2 is a view for showing a cross section of vertical bipolar transistor according to the present invention. Referring to FIG. 2, the vertical bipolar transistor comprises a semiconductor substrate 41, a first buried layer 43, a second burial layer 45, an epitaxial layer 47, a subcollector region 49, a base region 53, an emitter region 55, a collector contact region 57, a base contact region 59, an isolating oxide film 51, an insulating oxide film 61, an emitter electrode 63, a base electrode 64, and a collector electrode 65 therein.

Semiconductor substrate 41 is a P-type silicon substrate which is doped with an impurity such as boron and has an impurity concentration of approximately $1 \times 10^{15}$ atoms/cm$^3$. P-type epitaxial layer 47 is grown on semiconductor substrate 41. Both N$^+$-type first buried layer 43 and N$^+$-type second buried layer 45 define a portion of epitaxial layer 47 to form an active region 48 of the transistor so that the active region functions as a collector region, and P$^+$-type subcollector region 49 is formed in the lower portion of active region 48 of the transistor above $N^+$-type first buried layer 43. N-type base region 53 is formed at an upper portion of active region 48 above subcollector region 49, and $P^+$-type collector contact region 57 is formed at another upper portion of active region 48. Therefore, both base region 53 and collector contact region 57 is formed over subcollector region 49. $P^+$-type emitter region 55 is formed at an upper portion of base region 53, and $N^+$-type base contact region 59 is formed at another upper portion of base region 53.

Epitaxial layer 47 is doped with an impurity such as boron and has an impurity concentration of approximately $1\times10^{15}$ atoms/cm$^3$ to $1\times10^{17}$ atoms/cm$^3$, and has a thickness of approximately 1.0 µm to 2.0 µm.

First buried layer 43 is formed by heavily implanting a first impurity of N-type such as arsenic or antimony at a high dosage of approximately $1\times10^{15}$ atoms/cm$^2$ to $1\times10^{16}$ atoms/cm$^2$, to separate the elements of the vertical bipolar transistor in the vertical direction. Second buried layer 45 is formed by heavily implanting a N-type second impurity such as phosphorus at a high dosage of approximately $1\times10^{15}$ atoms/cm$^2$ to $1\times10^{16}$ atoms/cm$^2$ into an upper peripheral portion of first buried layer 43, activating the implanted N-type second impurity, and then out-diffusing the activated N-type second impurity at the same time as growing epitaxial layer 47, so that second buried layer 45 separates the elements of the vertical bipolar transistor in the horizontal direction. Second buried layer 45 which has been formed in this way has a dome-shaped concentration profile in the sectional view thereof wherein the width of the lower portion is greater than that of the upper portion.

In order to form second buried layer 45, the N-type second impurity is implanted into an adequate upper peripheral position of first buried layer 43. As a result, second buried layer 45 has a predetermined distance from subcollector region 49, so a parasite capacitance may be minimized, which is generated between subcollector region 49 and the isolating region (that is, the region which is formed by first buried layer 43 and second buried layer 45). First buried layer 43 and second buried layer 45 are overlapped to enclose active region 48 as an island so that active region 48 is separated from the elements of the adjacent vertical bipolar transistor. Active region 48 which is defined by first buried layer 43 as well as second buried layer 45 functions as the collector region. Therefore, a current flows in the perpendicular direction about semiconductor substrate 41.

Subcollector region 49 is formed by implanting an P-type impurity such as boron at a dosage of approximately $5\times10^{12}$ atoms/cm$^2$ to $5\times10^{13}$ atoms/cm$^2$. Subcollector region 49 not only reduces the serial resistance of the collector to increase a current driving force but also functions as a discharging path to improve the frequency characteristic of the transistor at the switching operation. Furthermore, subcollector region 49 increases the impurity concentration of the collector region to prevent the latch-up which is generated by a parasite NPN transistor which is formed by base region 53 and epitaxial layer 47 together with either first buried layer 43 or second buried layer 45.

Base region 53 is formed by implanting an N-type third impurity such as phosphorus or arsenic at a dosage of approximately $5\times10^{13}$ atoms/cm$^2$ to $1\times10^{14}$ atoms/cm$^2$ at an upper portion of active region 48. In addition, base contact region 59 is formed by heavily implanting an N-type forth impurity such as arsenic at a dosage of approximately $1\times10^{15}$ atoms/cm$^2$ to $1\times10^{16}$ atoms/cm$^2$ into an upper portion of base region 53, and emitter region 55 is formed by implanting a P-type impurity such as boron at a dosage of approximately $5\times10^{14}$ atoms/cm$^2$ to $1\times10^{15}$ atoms/cm$^2$ into another upper portion of base region 53, to be located adjacent to base contact region 59. Simultaneously, collector contact region 57 is formed by implanting a P-type impurity such as boron at a dosage of approximately $5\times10^{14}$ atoms/cm$^2$ to $1\times10^{15}$ atoms/cm$^2$ into another upper portion of active region 48, to separate from base region 53 by isolating oxide film 51. Since emitter region 55 and collector contact region 57 are simultaneously formed, the diffusion of the implanted impurities of first buried layer 43, second buried layer 45, subcollector region 49 and base region 53, may be minimized. Subsequently, emitter electrode 63, base electrode 64, collector electrode 65 are formed by interposing insulating oxide film 61 so as to contact emitter region 55, on base contact region 59 and on collector contact region 57, respectively.

FIGS. 3 to 7 are views for illustrating the steps for fabricating the vertical bipolar transistor according to one embodiment of the present invention.

Figure 3:
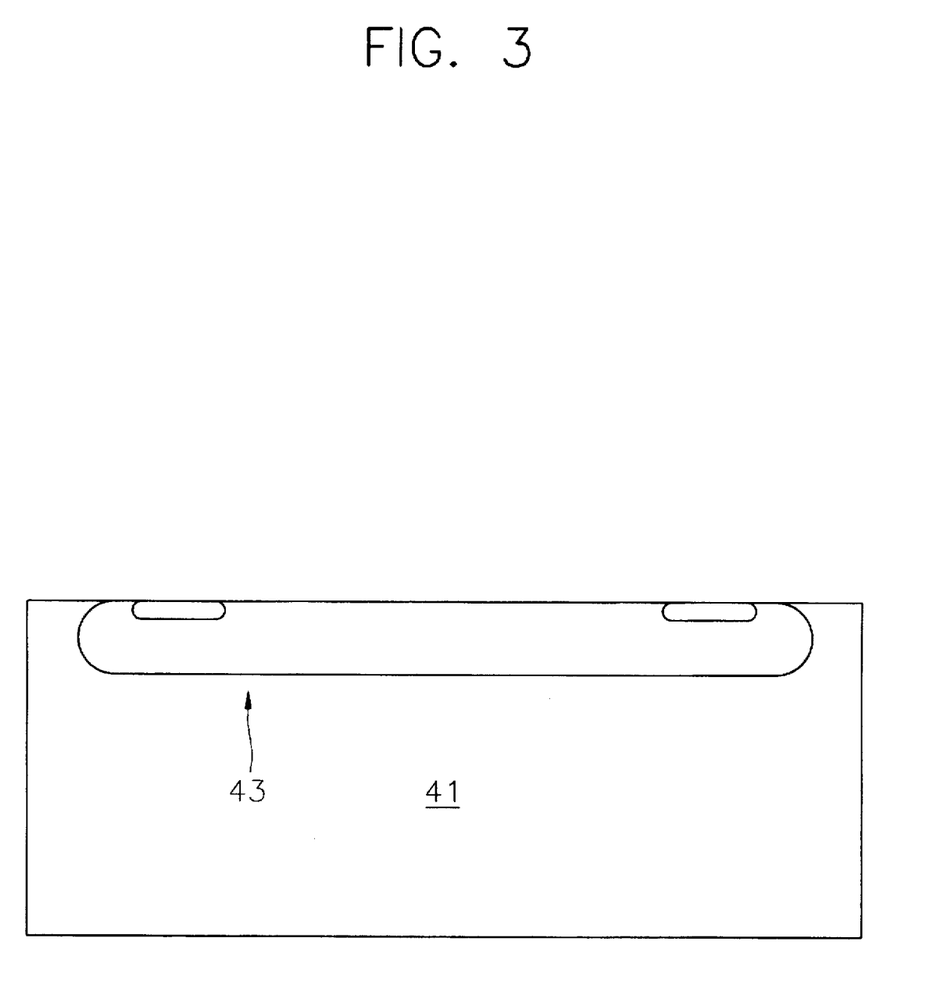
FIGS. 3 to 7 are views for illustrating the steps for fabricating the vertical bipolar transistor according to one embodiment of the present invention.

FIG. 3 is a view for illustrating the step of implanting the N-type second impurity into the upper peripheral portion of N-type first buried layer 43 after N-type first buried layer 43 is formed on P-type semiconductor substrate 41. Referring to FIG. 3, after P-type semiconductor substrate 41 is covered with a thermal oxide film (not shown) and a first photoresist layer (not shown) via a conventional method, each of the portions of the first photoresist layer and the thermal oxide film are removed to expose a predetermined surface portion of semiconductor substrate 41. Then, an N-type first impurity such as arsenic or antimony is implanted at the upper portion of semiconductor substrate 41 at an energy of between approximately 20 KeV and 60 KeV at a dosage of approximately $1\times10^{15}$ atoms/cm$^2$ to $1\times10^{16}$ atoms/cm$^2$. $N^+$-type first buried layer 43 is formed by annealing the implanted N-type first impurity at a temperature of between 1150° C. and 1250° C. and for 200 minutes to 300 minutes in an oxygen atmosphere in order to diffuse the implanted N-type first impurity. First buried layer 43 separates the elements of the vertical bipolar transistor in the perpendicular direction. After semiconductor substrate 41 and first buried layer 43 are covered again with a second photoresist layer (not shown), the second photoresist layer is partially removed to expose the upper peripheral portion of first buried layer 43. Successively, the N-type second impurity such as phosphorus which has a faster diffusion rate than that of arsenic or antimony, is heavily implanted at an energy of between approximately 20 KeV and 50 KeV and at a dosage of approximately $5\times10^{15}$ atoms/cm$^2$ to $5\times10^{16}$ atoms/cm$^2$, and annealing the heavily implanted N-type second impurity at a temperature of between 1100° C. and 1150° C., and for 30 minutes to 60 minutes in order to activate the heavily implanted N-type second impurity.

Figure 4:
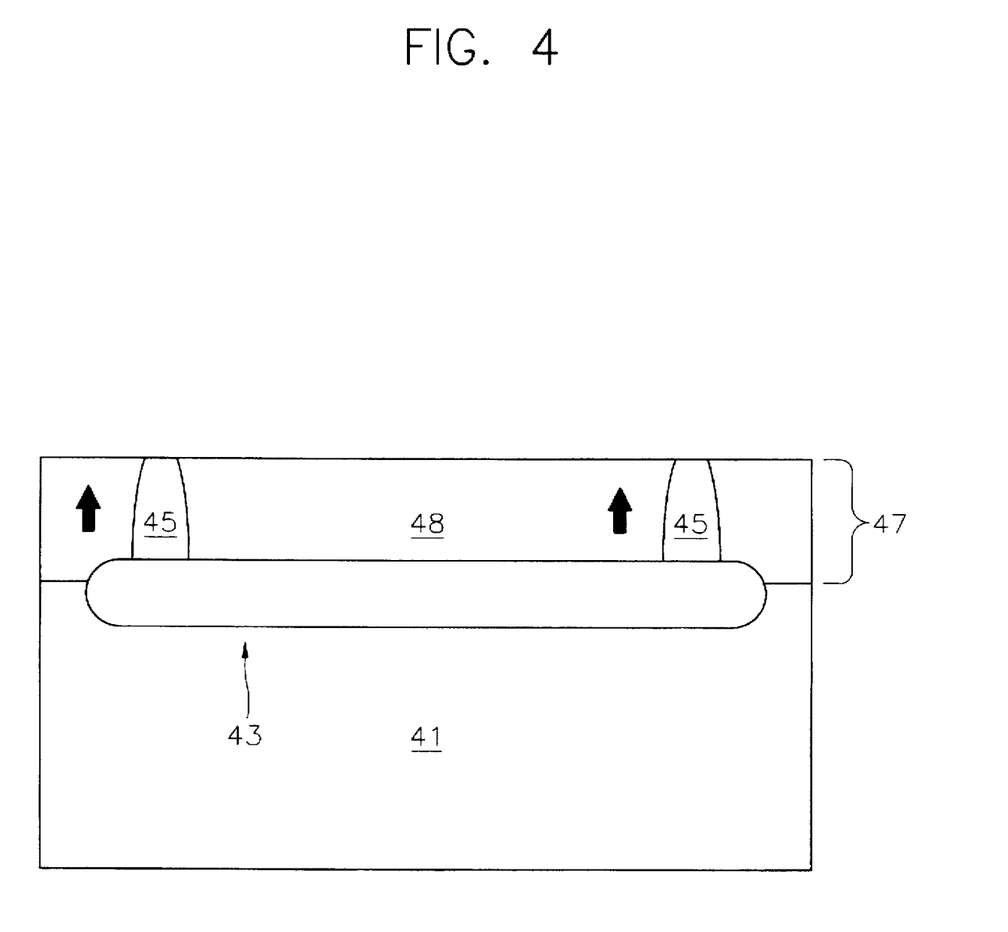

FIG. 4 is a view for illustrating the step of forming second buried layer 45 by out-diffusing the activated N-type second impurity at the same time as growing epitaxial layer 47, to define a portion of epitaxial layer 47 as active region 48 by both first buried layer 43 and second layer 45.

When second buried layer 45 is formed, the N-type second impurity may be implanted into the adequate portion of first buried layer 43 considering a distance from subcollector region 49.

P-type epitaxial layer 47 is grown by a liquid phase epitaxial (LPE) method on semiconductor substrate 41 having first buried layer 43 formed at a surface portion thereof.

P-type epitaxial layer 47 is doped with an P-type impurity such as boron at a temperature of between 1000° C. and 1200° C. to have an impurity concentration of approximately $1\times10^{15}$ atoms/cm$^3$ to $1\times10^{17}$ atoms/cm$^3$ and to have a thickness of approximately 1.0 μm to 2.0 μm. At this time, since the activated N-type second impurity such as phosphorus which resides at the upper peripheral portion of first buried layer 43, has a faster diffusion rate than that of the impurity such as arsenic or antimony of first buried layer 43, the activated N-type second impurity such as phosphorus out-diffuses along the upward direction which is shown by an arrow (shown in FIG. 4). This forms N$^+$-type second buried layer 45 at the same time as growing epitaxial layer 47 so that both first buried layer 43 and second buried layer 45 define active region 48. Active region 48 functions as the collector region. When the second buried layer 45 is formed according to above-mentioned steps, the heavily implanting operation of the N-type second impurity at a high energy and at a high dosage from a portion of surface of epitaxial layer 47 to first buried layer 43 to form second buried layer 45 in order to overlap first buried layer 43, is unnecessary. Further, it can assuredly separate the elements of the vertical bipolar transistor at the contact region between first buried layer 43 and second buried layer 45. Furthermore, the distance between subcollector region 49 and the isolating region can be adjusted by considering subcollect region 49 which is subsequently formed because the N-type second impurity is implanted into the adequate upper peripheral portion of the first buried layer 43 to form second buried layer 45, thereby both the parasite collector capacitance and the size of active region 48 may be minimized.

Figure 5:
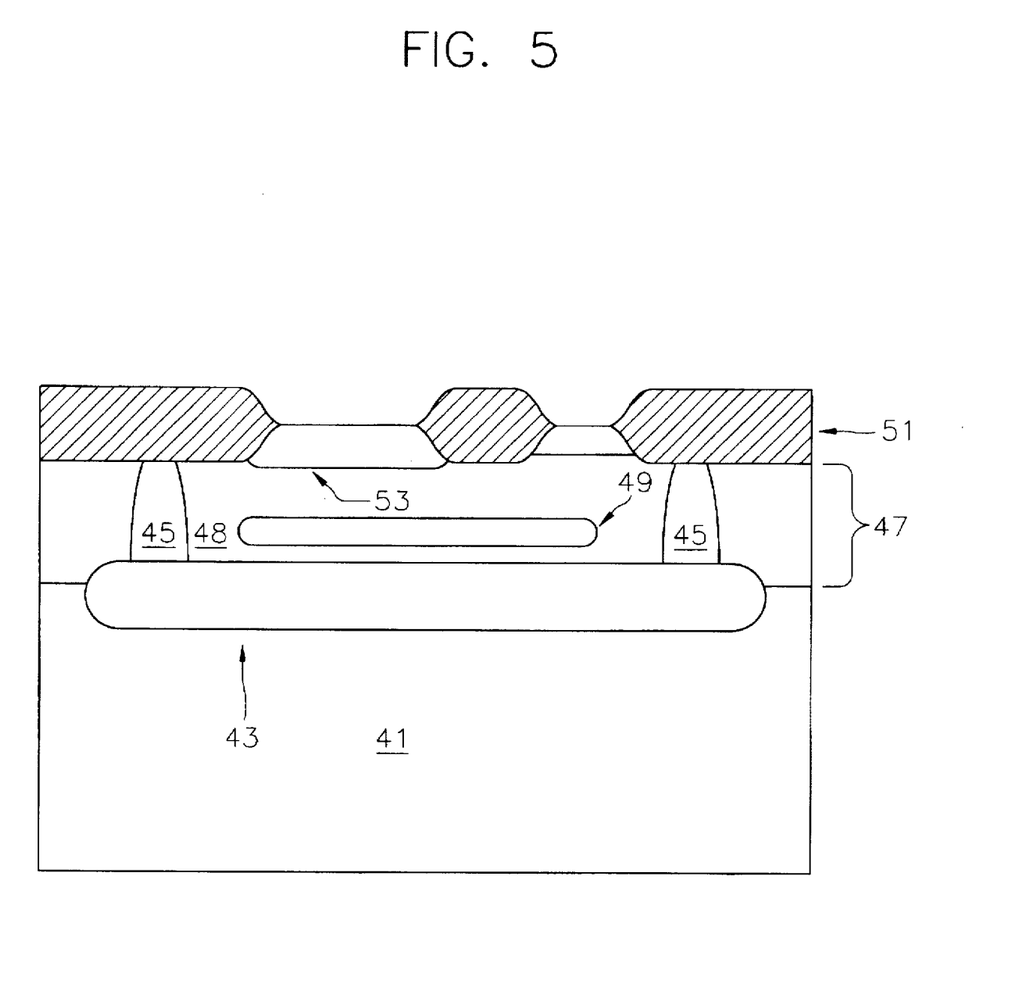

FIG. 5 is a view for illustrating the step of forming subcollector region 49, base region 53 and isolating oxide film 51. Referring to FIG. 5, P$^+$-type subcollector region 49 is formed in active region 48 which is defined by first buried layer 43 and second buried layer 45. After epitaxial layer 47 is covered with a third photoresist layer (not shown), a portion of active region 48 of epitaxial layer 47 is exposed by removing a portion of the third photoresist layer. Subsequently, an P-type impurity such as boron is implanted at a high energy of between approximately 0.5 MeV and 1.5 MeV and at a dosage of approximately $5\times10^{12}$ atoms/cm$^2$ to $5\times10^{13}$ atoms/cm$^2$ into the exposed portion of active region 48 by using the third photoresist layer as a mask. Then, subcollector region 49 is formed by annealing the implanted P-type impurity at a temperature of between 900° C. and 1000° C., and for 60 minutes to 100 minutes after the third photoresist layer is removed. Subcollector region 49 increases the current driving force by decreasing a serial resistance of the collector, and functions as a discharging path at the switching operation not only to improve the frequency characteristic of transistor but also to prevent the latch-up by the parasite NPN transistor.

Isolating oxide film 51 is formed on a portion of active region 48 as well as on epitaxial layer 47 except active region 48 by a local oxidation of silicon (LOCOS) method, and has a thickness of approximately 4000 Å to 6000 Å. N-type base region 53 is formed at an upper portion of active region 48 by using a forth photoresist layer (not shown). Base region 53 is formed by implanting an N-type third impurity such as phosphorus or arsenic at an energy of between approximately 20 KeV and 30 KeV, and at a dosage of $5\times10^{13}$ atoms/cm$^2$ to $1\times10^{14}$ atoms/cm$^2$, then annealing the N-type third impurity at a temperature of between 900° C. and 1000° C., and for 30 minutes to 60 minutes after removing the forth photoresist layer.

Figure 6:
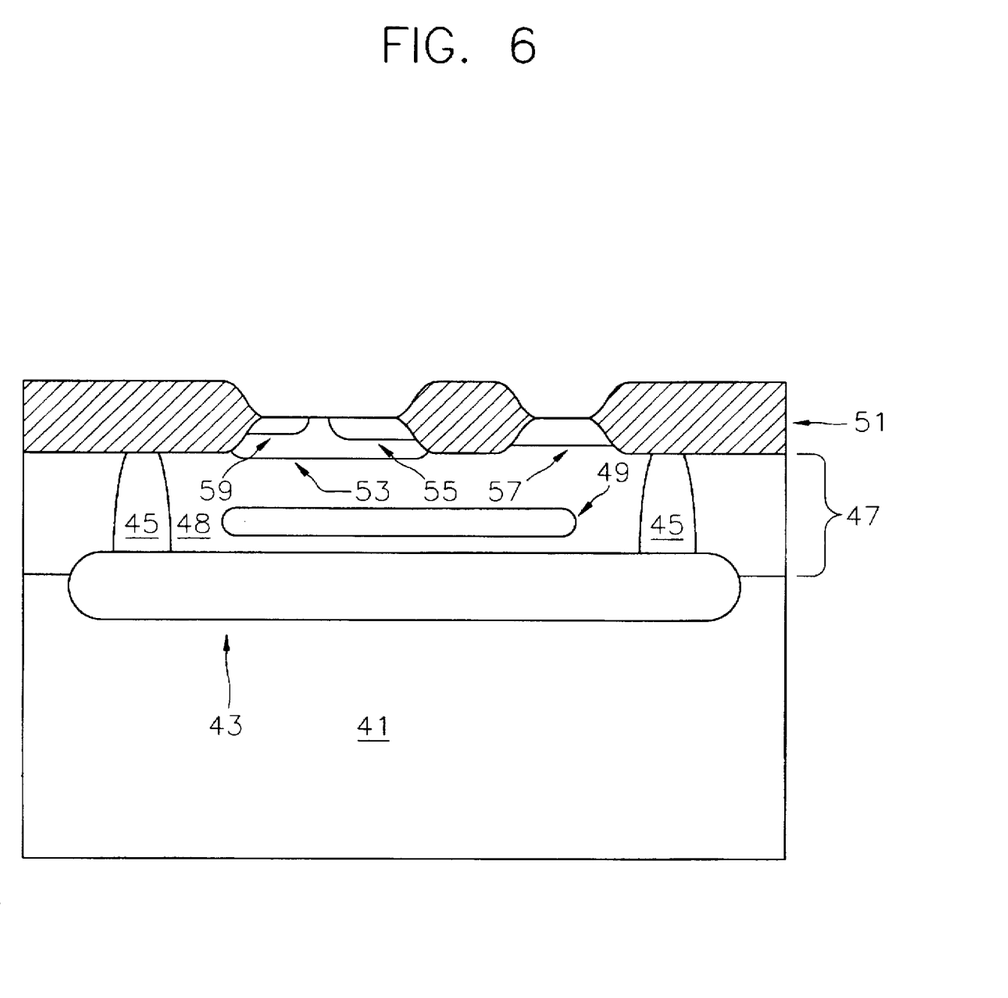

FIG. 6 is a view for illustrating the step of forming emitter region 55, collector contact region 57 and base contact region 59. Referring to FIG. 6, P$^+$-type emitter region 55 is formed on an upper portion of base region 53 at the same time as P$^+$-type collector contact region 57 is formed on another upper portion of active region 48. Both emitter region 55 and collector contact region 57 are formed by implanting a P-type impurity such as boron at an energy of between approximately 20 KeV and 40 KeV and at a dosage of approximately $5\times10^{14}$ atoms/cm$^2$ to $1\times10^{15}$ atoms/cm$^2$, then rapidly annealing the P-type implanted impurity by a rapid thermal annealing (RTA) method at a temperature of between 1000° C. and 1150° C., and for approximately one minute to two minutes in a nitrogen atmosphere. Since both emitter region 55 and collector contact region 57 are simultaneously formed according to the above-described steps, the diffusions of the impurities which reside in already formed regions due to subsequent steps, may be minimized. N$^+$-type base contact region 59 is formed by implanting an N-type forth impurity such as phosphorus or arsenic into another upper portion of base region 53 at a high energy of between approximately 20 MeV and 40 MeV and at a dosage of approximately $1\times10^{15}$ atoms/cm$^2$ to $1\times10^{16}$ atoms/cm$^2$, then rapidly annealing the implanted N-type forth impurity by rapid thermal annealing method at a temperature of between 1000° C. and 1150° C., and for approximately one minute to two minutes in a nitrogen atmosphere.

Figure 7:
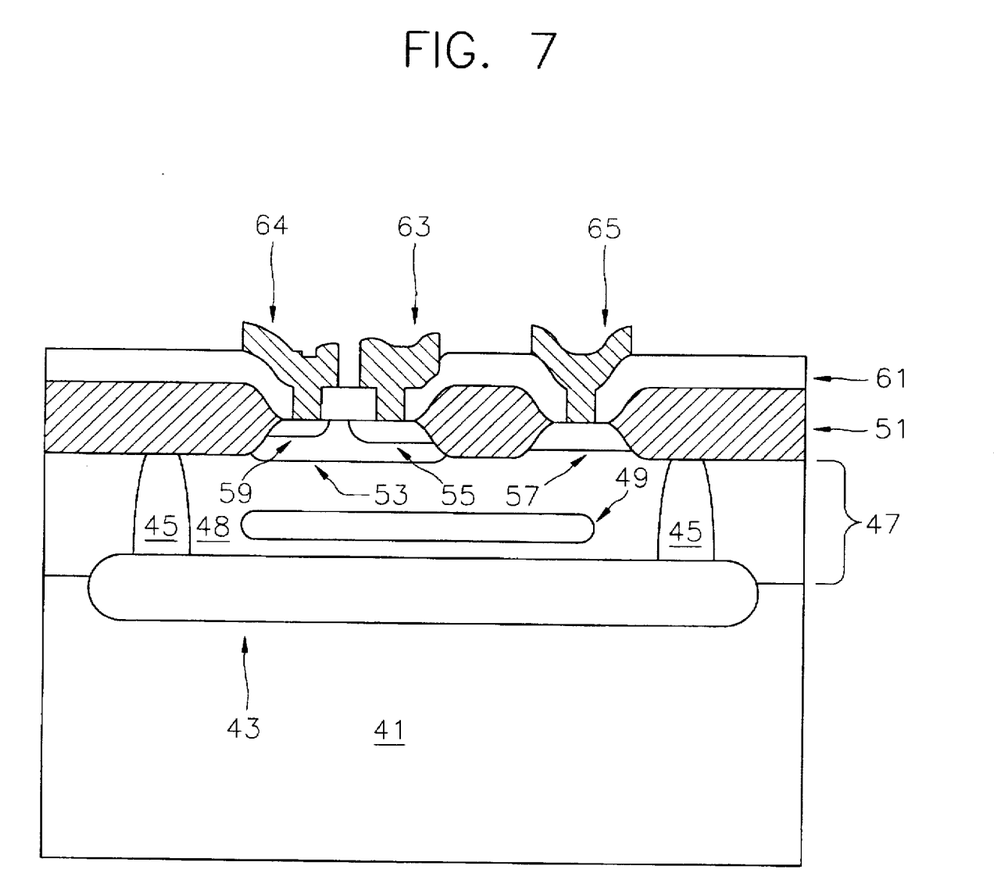

FIG. 7 is a view for illustrating the step of forming insulating oxide film 61, emitter electrode 63, base electrode 64 and collector electrode 65. Referring to FIG. 7, a surface of the vertical bipolar transistor having the above-described construction is covered with insulating oxide film 61 which has a thickness of approximately 5000 Å to 8000 Å by chemical vapor deposition (CVD) method. Then, an upper portion of base contact region 59, an upper portion of emitter region 55 and an upper portion of collector contact region 57 are exposed through the contact openings by a photolithography method. Continuously, after a conductive metal such as aluminum or silver is deposited on the exposed portions by a sputtering or a vacuum evaporation process, and then base electrode 64, emitter electrode 63 and collector electrode 65 are respectively formed on the upper portions of base contact region 59, emitter region 55 and collector contact region 57 by a conventional photolithography method.

As described above, in the method for fabricating the vertical bipolar transistor according to one embodiment of the present invention, after the N-type second impurity is implanted into the upper peripheral portion of the first buried layer and the implanted N-type second impurity is activated, then the second buried layer is formed through out-diffusing the activated N-type second impurity at the same time as the epitaxial layer is grown. Both the first buried layer and the second buried layer define the portion of epitaxial layer to form the active region which functions as the collector region. The subcollector region is formed above the first buried layer in the active region, and the base region is formed at the first upper portion of the active region over the subcollector region. Therefore, according to present invention, the second buried layer is formed by implanting the N-type second impurity and activating the implanted N-type second impurity at the same time as growing the epitaxial layer, so the second buried layer can definitely separate the elements of the transistor. Also, the base region which as a thin width can be reproducibly formed by implanting the N-type third impurity and annealing the N-type implanted third impurity in a nitrogen atmosphere.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A method for fabricating a vertical bipolar transistor, which comprises the steps of:
   i) implanting a first impurity of a second conductivity type into a portion of a surface of a first conductivity type semiconductor substrate and annealing the implanted first impurity of the second conductivity type to form a first buried layer;
   ii) implanting a second impurity of the second conductivity type into an upper peripheral portion of said first buried layer, and activating the implanted second impurity of the second conductivity type;
   iii) defining an active region by growing an epitaxial layer of the first conductivity type on said semiconductor substrate having said first buried layer at a surface portion thereof, and out-diffusing the activated second impurity of the upper peripheral portion of said first buried layer, to form a second buried layer of the second conductivity type, said second buried layer having a higher impurity concentration than that of said first buried layer, both said first buried layer and said second buried layer defining a portion of said epitaxial layer as said active region;
   iv) forming a base region of the second conductivity type by implanting a third impurity of the second conductivity type into a first upper portion of said active region and annealing the implanted third impurity; and
   v) completing a fabrication of the vertical bipolar transistor by forming an emitter region, a base contact region and a collector contact region at upper portions of said active region, wherein the step v) comprises the substeps of:
      a) forming an isolating oxide film on a portion of said active region as well as on an upper portion of said epitaxial layer except said active region;
      b) forming the emitter region of the first conductivity type at a first upper portion of said base region, and the collector contact region of the first conductivity type at a second upper portion of said active region, said collector contact region having a higher impurity concentration than that of said epitaxial layer;
      c) forming the base contact region of the first conductivity type at a second upper portion of said base region, said base contact region having a higher impurity concentration than that of said base region; and
      d) forming a base electrode on a surface of said base region, an emitter electrode on a surface of said emitter region and a collector electrode on a surface of said collector contact region.

2. The method for fabricating a vertical bipolar transistor as claimed in claim 1, wherein said emitter region and said collector contact region are simultaneously formed.

3. The method for fabricating a vertical bipolar transistor as claimed in claim 1, further comprising the step of:
   forming a subcollector region of the first conductivity type in said active region therein above said first buried layer after the step iii).

4. The method for fabricating a vertical bipolar transistor as claimed in claim 3, wherein said subcollector region is formed by implanting an impurity of the first conductivity type at an energy of between approximately 0.5 MeV and 1.5 MeV and at a dosage of approximately $5 \times 10^{12}$ atoms/$cm^2$ to $5 \times 10^{13}$ atoms/$cm^2$, and annealing the implanted first impurity of the first conductivity type at a temperature of between 900° C. and 1000° C. and for 60 minutes to 100 minutes in a nitrogen atmosphere.

5. The method for fabricating a vertical bipolar transistor as claimed in claim 1, wherein the first conductivity type is a P-type and the second conductivity type is an N-type.

6. The method for fabricating a vertical bipolar transistor as claimed in claim 1, wherein said first buried layer is formed by implanting the first impurity of the second conductivity type at an energy of between approximately 20 KeV and 60 KeV and at a dosage of approximately $1 \times 10^{15}$ atoms/$cm^2$ to $1 \times 10^{16}$ atoms/$cm^2$, and annealing the implanted first impurity of the second conductivity type at a temperature of between 1150° C. and 1250° C. and for 200 minutes to 300 minutes in an oxygen atmosphere.

7. The method for fabricating a vertical bipolar transistor as claimed claim 1, wherein the second impurity of the second conductivity type is a phosphorus and said second buried layer is formed by implanting the phosphorus at an energy of between approximately 20 KeV and 50 KeV and at a dosage of approximately $5 \times 10^{15}$ atoms/$cm^2$ to $5 \times 10^{16}$ atoms/$cm^2$.

8. The method for fabricating a vertical bipolar transistor as claimed in claim 7, wherein said second buried layer is formed by annealing the implanted phosphorus at a temperature of between 1000° C. and 1150° C. and for 30 minutes to 60 minutes to be activated.

9. The method for fabricating a vertical bipolar transistor as claimed in claim 8, wherein said second buried layer is formed by out-diffusing the activated phosphorus at the same time as growing said epitaxial layer of the first conductivity type on said first buried layer as well as on said semiconductor substrate.

10. The method for fabricating a vertical bipolar transistor as claimed in claim 1, wherein said base region is formed by implanting the third impurity of the second conductivity type at an energy of between approximately 20 KeV and 30 KeV and at a dosage of approximately $5 \times 10^{13}$ atoms/$cm^2$ to $1 \times 10^{14}$ atoms/$cm^2$, and annealing the implanted third impurity of the second conductivity type at a temperature of between 900° C. and 1000° C. and for 30 minutes to 60 minutes.

11. A method for fabricating a vertical bipolar transistor, which comprises the steps of:
   i) implanting a first impurity of a second conductivity type into a portion of a surface of a first conductivity type semiconductor substrate and annealing the implanted first impurity of the second conductivity type to form a first buried layer;
   ii) implanting a second impurity of the second conductivity type into an upper peripheral portion of said first buried layer, and activating the implanted second impurity of the second conductivity type;
   iii) defining an active region by growing an epitaxial layer of the first conductivity type on said semiconductor substrate having said first buried layer at a surface portion thereof at the same time as out-diffusing the activated second impurity of the upper peripheral portion of said first buried layer, to form a second buried layer of the second conductivity type, said second buried layer having higher impurity concentration than that of said first buried layer, both said first buried layer and said second buried layer defining a portion of said epitaxial layer as said active region;
   iv) forming a subcollector region of the first conductivity type at said active region above said first buried layer;

v) forming an isolating oxide film on a portion of said active region and on said epitaxial layer except said active region;

vi) forming a base region of the second conductivity type by implanting a third impurity of the second conductivity type into a first upper portion of said active region, and annealing the implanted third impurity of the second conductivity type;

vii) forming an emitter region of the first conductivity type at a first upper portion of said base region at the same time as forming a collector contact region of the first conductivity type at a second upper portion of said active region, said collector contact region having a higher impurity concentration than that of said epitaxial layer;

viii) forming a base contact region of the first conductivity type at a second upper portion of said base region, said base contact region having a higher impurity concentration than that of said base region; and ix) forming a base electrode on a surface of said base contact region, an emitter electrode on a surface of said emitter region and a collector electrode on a surface of said collector contact region.

12. The method for fabricating a vertical bipolar transistor as claimed in claim 11, wherein said subcollector region is formed by implanting an impurity of the first conductivity type at an energy of between approximately 0.5 MeV and 1.5 MeV and at a dosage of approximately $5 \times 10^{12}$ atoms/$cm^2$ to $5 \times 10^{13}$ atoms/$cm^2$, and annealing the implanted impurity of the first conductivity type at a temperature of between 900° C. and 1000° C. and for 60 minutes to 100 minutes in a nitrogen atmosphere.

13. The method for fabricating a vertical bipolar transistor as claimed in claim 11, wherein the first conductivity type is a P-type and the second conductivity type is an N-type.

14. The method for fabricating a vertical bipolar transistor as claimed in claim 11, wherein said first buried layer is formed by implanting the first impurity of the second conductivity type at an energy of between approximately 20 KeV and 60 KeV and at a dosage of approximately $1 \times 10^{15}$ atoms/$cm^2$ to $1 \times 10^{16}$ atoms/$cm^2$, and annealing the implanted first impurity of the second conductivity type at a temperature of between 1150° C. and 1250° C. and for 200 minutes to 300 minutes in an oxygen atmosphere.

15. The method for fabricating a vertical bipolar transistor as claimed in claim 11, wherein the second impurity of the second conductivity type is a phosphorus and said second buried layer is formed by implanting the phosphorous at an energy of between approximately 20 KeV and 50 KeV and at a dosage of approximately $5 \times 10^{15}$ atoms/$cm^2$ to $5 \times 10^{16}$ atoms/$cm^2$.

16. The method for fabricating a vertical bipolar transistor as claimed in claim 15, wherein said second buried layer is formed by annealing the implanted phosphorous at a temperature of between 1000° C. and 1150° C. and for 30 minutes to 60 minutes in an oxygen atmosphere to be activated.

17. The method for fabricating a vertical bipolar transistor as claimed in claim 16, wherein said base region is formed by implanting the third impurity of the second conductivity type at an energy of between approximately 20 KeV and 30 KeV and at a dosage of approximately $5 \times 10^{13}$ atoms/$cm^2$ to $1 \times 10^{14}$ atoms/$cm^2$, and annealing the implanted third impurity of the second conductivity type at a temperature of between 900° C. and 1000° C. and for 30 minutes to 60 minutes in a nitrogen atmosphere.

\* \* \* \* \*